US010186556B2

(12) United States Patent
Choi et al.

(10) Patent No.: US 10,186,556 B2
(45) Date of Patent: Jan. 22, 2019

(54) THIN FILM TRANSISTOR ARRAY SUBSTRATE AND ORGANIC LIGHT EMITTING DIODE DISPLAY DEVICE INCLUDING THE SAME

(71) Applicant: LG DISPLAY CO., LTD., Seoul (KR)

(72) Inventors: Howon Choi, Paju-si (KR); Hyesook Kim, Seoul (KR); MoonBae Gee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/201,951

(22) Filed: Jul. 5, 2016

(65) Prior Publication Data

US 2017/0025482 A1 Jan. 26, 2017

(30) Foreign Application Priority Data

Jul. 22, 2015 (KR) ........................ 10-2015-0103440

(51) Int. Cl.
| | |
|---|---|
| *H01L 29/08* | (2006.01) |
| *H01L 35/24* | (2006.01) |
| *H01L 51/00* | (2006.01) |
| *H01L 27/32* | (2006.01) |
| *H01L 51/52* | (2006.01) |
| *H01L 27/12* | (2006.01) |

(52) U.S. Cl.
CPC ........ *H01L 27/3213* (2013.01); *H01L 27/322* (2013.01); *H01L 27/3246* (2013.01); *H01L 27/3248* (2013.01); *H01L 27/3262* (2013.01); *H01L 51/5206* (2013.01); *H01L 51/5221* (2013.01); *H01L 51/5281* (2013.01); *H01L 51/5284* (2013.01); H01L 27/1214 (2013.01); H01L 27/3244 (2013.01)

(58) Field of Classification Search
CPC .............. H01L 27/322; H01L 27/3213; H01L 51/5265; H01L 51/56; H01L 51/5206; H01L 27/3206
USPC .................... 257/40, 79, 89; 438/29, 27, 35; 313/504, 506, 500
See application file for complete search history.

(56) References Cited

U.S. PATENT DOCUMENTS

| | | | |
|---|---|---|---|
| 2003/0025977 A1* | 2/2003 | Takizawa | .......... G02F 1/133555 359/245 |
| 2007/0069635 A1 | 3/2007 | Cok | |
| 2007/0114526 A1* | 5/2007 | Yokoyama | .......... H01L 51/5218 257/40 |
| 2007/0188696 A1* | 8/2007 | Kim | .................... G02F 1/13363 349/156 |

(Continued)

FOREIGN PATENT DOCUMENTS

| | | |
|---|---|---|
| CN | 101556989 A | 10/2009 |
| CN | 103915471 A | 7/2014 |
| DE | 102013114150 A1 | 7/2014 |

*Primary Examiner* — Lex Malsawma
*Assistant Examiner* — Nduka Ojeh
(74) *Attorney, Agent, or Firm* — Dentons US LLP

(57) ABSTRACT

A thin film transistor array substrate and an organic light emitting diode (OLED) display device including the same are disclosed in which a color layer is disposed on a first substrate corresponding to a white sub-pixel and a non color filter area is included in a second substrate corresponding to the white sub-pixel, and thus, it is possible to lower an amount of reflectance of external light, increase a luminance efficiency, and reduce a power consumption of the OLED display device.

19 Claims, 10 Drawing Sheets

(56) References Cited

U.S. PATENT DOCUMENTS

| | | | |
|---|---|---|---|
| 2009/0108743 A1* | 4/2009 | Kobayashi | H01L 51/5281 |
| | | | 313/504 |
| 2010/0052524 A1* | 3/2010 | Kinoshita | H01L 51/5265 |
| | | | 313/504 |
| 2010/0060148 A1* | 3/2010 | Hwang | H01L 27/3213 |
| | | | 313/504 |
| 2012/0138966 A1 | 6/2012 | Shin | |
| 2012/0326950 A1* | 12/2012 | Park | G09G 3/3607 |
| | | | 345/55 |
| 2014/0077185 A1* | 3/2014 | Lee | H01L 51/5275 |
| | | | 257/40 |
| 2014/0183480 A1* | 7/2014 | Lee | H01L 51/5012 |
| | | | 257/40 |
| 2014/0284575 A1* | 9/2014 | Sugisawa | H01L 51/5218 |
| | | | 257/40 |
| 2015/0048345 A1 | 2/2015 | Suzuki et al. | |
| 2015/0349029 A1 | 12/2015 | Choi et al. | |

* cited by examiner

THIN FILM TRANSISTOR ARRAY SUBSTRATE AND ORGANIC LIGHT EMITTING DIODE DISPLAY DEVICE INCLUDING THE SAME

CROSS-REFERENCE TO RELATED APPLICATIONS

This application claims priority to and benefit from Korean Patent Application No. 10-2015-0103440 filed on Jul. 22, 2015.

BACKGROUND

Field of the Invention

The present invention relates to an organic light emitting diode (OLED) display device and a method of manufacturing the same, and more particularly, to a thin film transistor array substrate of an OLED display device and method of manufacturing the same.

Description of the Related Art

With the development of an information-oriented society, a demand for a display device for displaying an image has increased in various forms, and in recent years, various flat display devices such as a liquid crystal display device (LCD), a plasma display panel device (PDP), and an organic light emitting diode (OLED) display device have been used.

Among these display devices, OLED display devices use a self light emitting element, in other words a self-luminous element, and as a result, a backlight, which is used in an LCD device, is typically not required. Thus, OLED display devices can be lightweight and can have thin profile. Further, OLED display devices have wider view angle and higher contrast ratio than LCD devices and are also advantageous in power consumption. In addition, since OLED display devices can be driven with a direct current at a low voltage and have a high response speed and solid internal components, OLED display devices are resistant to external shocks and have a broader usable temperature range and have low manufacturing costs.

OLED display devices may display an image using a top emission scheme or a bottom emission scheme according to the structure of an organic light emitting element including a first electrode, a second electrode, and an organic emission layer. In the bottom emission scheme, visible light generated from the organic emission layer is displayed at the bottom of a substrate on which a TFT array is formed or located, while in the top emission scheme, visible light generated from the organic emission layer is displayed at the top of the substrate on which a TFT array is formed or located.

An OLED display device often includes a circular polarizing plate to implement a black of the OLED display device. In other words, an OLED display device may include a circular polarizing plate to improve the appearance of black and to reduce an amount of reflection by external light, thereby to improve the user's visibility. However, when an OLED display device uses a circular polarizing plate, its transmittance may be reduced, and as a result, its panel efficiency may deteriorate and its power consumption may increase.

In order to address these problems, an OLED display device may include a color filter disposed in a white sub-pixel area to reduce an amount of reflection by external light, instead of using a circular polarizing plate. In such a case, the light emitted from the organic light emitting element may be, however, absorbed in the color filter, and as a result, its light efficiency may deteriorate and its power consumption may increase.

BRIEF SUMMARY

Accordingly, the present invention is directed to an organic light emitting diode (OLED) display device and a method of manufacturing the same that substantially obviate one or more of the problems due to limitations and disadvantages of the related art.

An advantage of the present invention is to provide an OLED display device capable of reducing amount of reflectance while improving light efficiency and lowering power consumption.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a thin film transistor array substrate may, for example, include a substrate divided into red, green, blue, and white sub-pixel areas; a thin film transistor and a light emitting layer in each sub-pixel area; a first electrode electrically connected with the thin film transistor and comprising a first layer and a third layer disposed to overlap with the first layer; and a first color layer between the first layer and the third layer of the first electrode in each white sub-pixel area.

The thin film transistor array substrate may further comprise a bank pattern disposed to overlap with a part of an upper surface of the first electrode and defining an emission area and a non-emission area, and a second electrode disposed on the light emitting layer and the bank pattern.

Preferably, the light emitting layer is an organic light emitting layer.

Also, the thin film transistor array substrate may include a second substrate disposed to face the first substrate and red, green, and blue color filters disposed on one surface of the second substrate and provided in areas corresponding to the red, green, and blue sub-pixel areas, respectively, and a first non color filter area in an area corresponding to the first color layer.

Herein, the first color layer may be constituted by colors being consisted of red, green, blue, white, or a combination thereof. The first color layer can be disposed to expose an edge of the first layer of the first electrode. Also, an end of the first color layer can be disposed to overlap with an end of the first layer of the first electrode. Further, a fourth layer may be disposed on the second layer of the first electrode disposed in the white, red, green, and blue sub-pixel areas. In this case, the first layer, the third layer, and the fourth layer of the first electrode can be made of transparent conductive materials and the second layer thereof is made of a reflective material. Further, the first color layer may be integrally constituted in a plurality of white sub-pixel areas disposed in a vertical direction. In addition, the thin film transistor array substrate and the OLED display device may further include a second color layer disposed on the same layer as the first color layer in at least one area of the red, green, and blue sub-pixel areas.

The second color layer may be constituted by a red color in the red sub-pixel area, a green color in the green sub-pixel area, and a blue color in the blue sub-pixel area. Further, the thin film transistor array substrate and the OLED display device may further include a second non color filter area in the red, green, or blue sub-pixel area of the second substrate corresponding to the area with the second color layer.

In another aspect, an organic light emitting diode (OLED) display device having a thin film transistor array substrate may, for example, include a plurality of pixels on a substrate, each pixel including red, green, blue, and white sub-pixel areas; a thin film transistor and an organic light emitting layer in each sub-pixel area; and a first electrode in each sub-pixel area, the first electrode electrically connected with the thin film transistor and including a first color layer in the white sub-pixel area.

It is to be understood that both the foregoing general description and the following detailed description are exemplary and explanatory and are intended to provide further explanation of the invention as claimed.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE ILLUSTRATED EMBODIMENT

Figure 1:
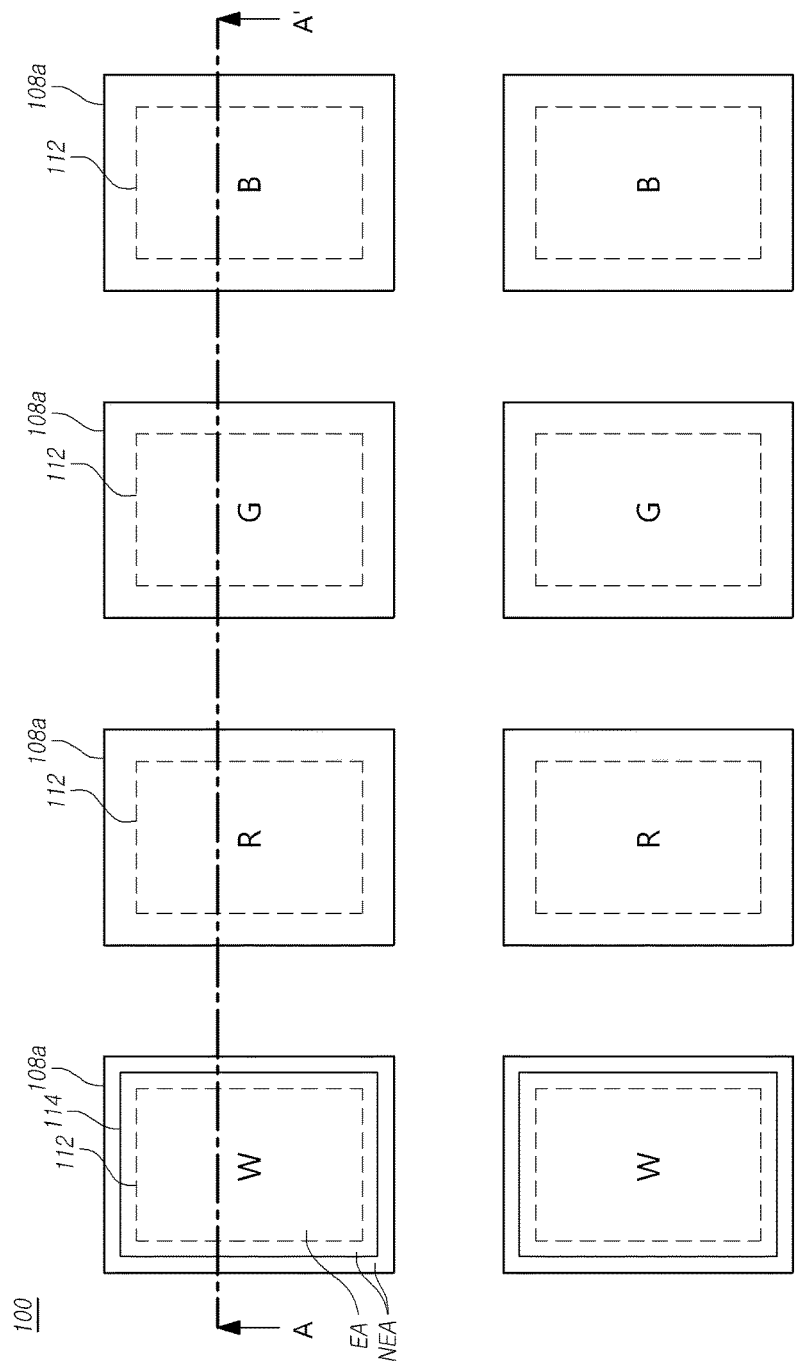
FIG. 1 is a plan view schematically illustrating an organic light emitting diode (OLED) display device according to a first exemplary embodiment of the present invention.

Hereinafter, exemplary embodiments of the present invention will be described with reference to the accompanying drawings. The following introduced exemplary embodiments are provided as examples so that the present invention will fully convey the present invention to those skilled in the art. As those skilled in the art would realize, the described embodiments may be modified in various different ways, all without departing from the scope of the present invention. In addition, in the drawings, the size and the thickness of an apparatus may be exaggerated and expressed for easy description. Like reference numerals designate like elements throughout the specification.

Various advantages and features of the present invention and methods accomplishing thereof will become apparent from the following description of exemplary embodiments with reference to the accompanying drawings. However, the present invention is not limited to the following exemplary embodiments but may be implemented in various different forms. The exemplary embodiments are provided only to completely disclose the present invention and to fully provide a person having ordinary skill in the art to which the present invention pertains with the category of the invention. The present invention is defined by the appended claims. Throughout the whole specification, the same reference numerals denote the same elements. The sizes and relative sizes of layers and areas marked in the drawings may be exaggerated for clarity of description.

When an element or a layer is referred to as being "on" another element or layer, it may be directly on the other element or layer, or intervening elements or layers may be present. On the contrary, designating that the elements are "directly on" or "just above" represents the case where other elements or layers are not interposed therebetween.

Below", "beneath", "lower", "above", "upper", and the like which are spatially relative terms may be used to easily describe correlation between one element or component and other elements or components as illustrated in the drawings. The spatially relative terms should be appreciated as terms including different directions of the element when it is in use or in operation in addition to directions illustrated in the drawings. For example, when an element illustrated in the drawings is turned over, an element described to be "below" or "beneath" other elements may be laid "above" other elements. Accordingly, "below" which is an exemplary term may include both upper and lower directions.

The terms used in the present specification are for explaining the exemplary embodiments rather than limiting the present invention. Unless particularly stated otherwise in the present specification, a singular form also includes a plural form. The meaning of "comprise" and/or "comprising" used in this specification does not exclude the existence or addition of aforementioned constituent elements, steps, operations, and/or device, and one or more other constituent elements, steps, operations, and/or devices.

FIG. 1 is a plan view schematically illustrating an organic light emitting diode (OLED) display device according to a first exemplary embodiment of the present invention.

Referring to FIG. 1, an OLED display device according to a first exemplary embodiment of the present invention includes a plurality of sub-pixels disposed on a first substrate 100. Particularly, the OLED display device includes a plurality of white W sub-pixels, red R sub-pixels, green G sub-pixels, and blue B sub-pixels, which are disposed on the first substrate 100.

The white W sub-pixels, the red R sub-pixels, the green G sub-pixels, and the blue B sub-pixels may be alternately disposed in a horizontal direction which is a width direction. In addition, the plurality of white W sub-pixels may be disposed in a vertical direction which is a height direction, and the plurality of red R sub-pixels, green G sub-pixels, and blue B sub-pixels may also be disposed in a vertical direction, respectively.

In this case, the plurality of sub-pixels may be divided into an emission area EA and a non-emission area NEA by a bank pattern 112 disposed on the first substrate 100. That is, the bank patterns 112 may be disposed in areas except for the emission areas EA of the white W sub-pixel, the red R sub-pixel, the green G sub-pixel, and the blue B sub-pixel.

The bank patterns 112 may be disposed to overlap with each other in a partial area of the first electrode of an organic light emitting element. That is, the bank pattern 112 may be disposed to expose a part of an upper surface of the first electrode of the organic light emitting element.

In addition, in the white W sub-pixel area, the bank pattern 112 may be disposed to overlap with a part of the color layer 114. In addition, the bank pattern 112 may be disposed to overlap with a first layer 108a of the first electrode of the organic light emitting element. Further, the color layer 114 may be disposed to overlap with the first layer 108a of the first electrode of the organic light emitting element. In this case, the color layer 114 may be disposed to expose an edge of the first layer 108a of the first electrode. In the OLED display device according to the first exemplary embodiment of the present invention, the color layer 114 may be disposed only in the white W sub-pixel.

Figure 2:
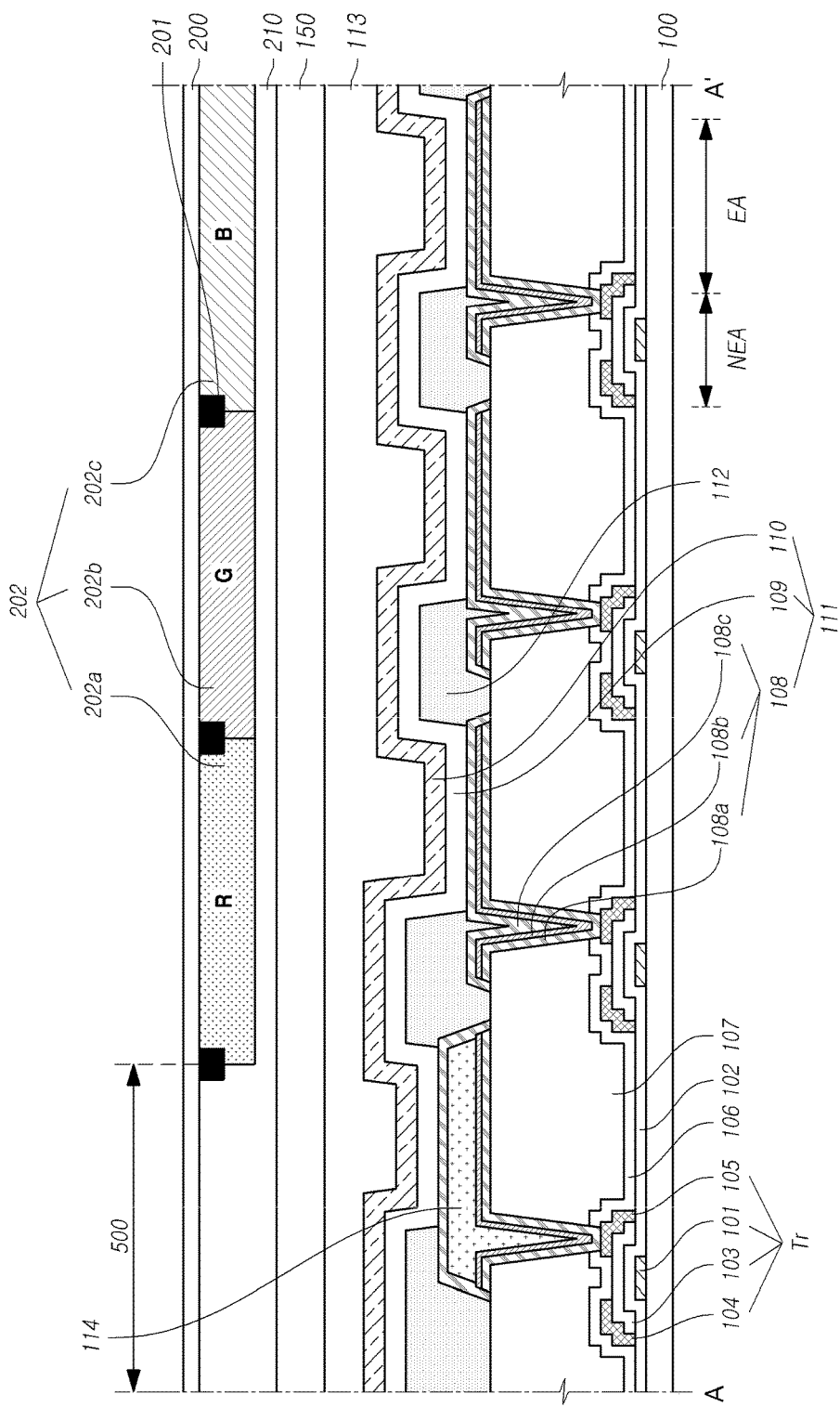
FIG. 2 is a cross-sectional view of the OLED display device taken along line A-A' according to the first exemplary embodiment of the present invention.

Next, the OLED display device according to the first exemplary embodiment of the present invention will be described below in detail with reference to FIG. 2. FIG. 2 is a cross-sectional view of the OLED display device taken along line A-A' according to the first exemplary embodiment of the present invention.

Referring to FIG. 2, the first substrate 100 of the OLED display device according to the first exemplary embodiment of the present invention is divided into white, red, green, and blue sub-pixels. The OLED display device includes a thin film transistor Tr disposed on the white, red, green, and blue sub-pixels of the first substrate 100, and an organic light emitting element 111 electrically connected with the thin film transistor Tr, and includes a color filter layer 202 disposed on one surface of a second substrate 200 disposed to face the first substrate 100.

In detail, the thin film transistor Tr includes a gate electrode 101, an active layer 103, a source electrode 104, and a drain electrode 105. The organic light emitting element 111 includes a first electrode 108, an organic light emitting layer 109, and a second electrode 110. Further, the color filter layer 202 includes a red color filter 202a, a green color filter 202b, and a blue color filter 202c.

In more detail, gate electrodes 101 are disposed in each sub-pixel area of the first substrate 100. The gate electrode 101 may be formed by depositing Cu, Mo, Al, Ag, Ti, and an alloy constituted from a combination thereof or at least one of ITO, IZO and ITZO as a transparent conductive material. However, the materials are not limited thereto and may be formed of materials commonly used to form gate electrodes and gate lines. Further, in FIG. 2, the gate electrode 101 is constituted by a single metal layer, but may be constituted by depositing at least two metal layers in some cases.

A gate insulating layer 102 is disposed on the first substrate 100 including the gate electrode 101. An active layer 103 is disposed in each sub-pixel area so as to overlap with the gate electrodes 101 on the first substrate 100 disposed with the gate insulating layer 102. Further, although not illustrated, an etch stop layer for protecting a channel area of the active layer 103 may be further disposed on the active layer 103.

In addition, a source electrode 104 and a drain electrode 105 are provided so as to overlap with the active layers 103 and be spaced apart from each other. The source electrode 104 and the drain electrode 105 may be formed by depositing Cu, Mo, Al, Ag, Ti, and an alloy constituted from a combination thereof or at least one of ITO, IZO and ITZO as a transparent conductive material. However, the materials are not limited thereto and may be formed of materials commonly used to form data lines. Further, in FIG. 2, the source electrode 104 and the drain electrode 105 are constituted by a single metal layer, but may be constituted by depositing at least two metal layers in some cases. As such, the thin film transistor Tr may be disposed on the first substrate 100.

An interlayer insulation layer 106 and a planarization layer 107 are disposed on the first substrate 100 including the thin film transistor Tr. Herein, in the interlayer insulation layer 106 and the planarization layer 107, a contact hole which exposes a part of the drain electrode 105 of the thin film transistor Tr may be formed or located.

The first electrode 108 of the organic light emitting element 111 which is connected with the drain electrode 105 of the thin film transistor Tr is disposed on the planarization layer 107. Herein, the first electrode 108 may be constituted by a first layer 108a, a second layer 108b disposed to overlap with the first layer 108a, and a third layer 108c disposed to overlap with the second layer 108b.

Herein, the first layer 108a and the third layer 108c are made of a transparent conductive material with a high work function and the second layer 108b may be made of a reflective material. For example, the first layer 108a and the third layer 108c may be made of any one selected from a group including indium tin oxide (ITO), indium zinc oxide (IZO), and ZnO, and the second layer 108b may be made of any one selected from a group including Al, an Al-alloy, Ag, or an Ag-alloy, but are not limited thereto.

Further, the color layer 114 may be disposed to overlap with first electrode 108 of the organic light emitting element 111 disposed in the white sub-pixel. Particularly, the color layer 114 may be disposed on the second layer 108b of the first electrode 108. That is, the color layer 114 may be disposed between the second layer 108b and the third layer 108c of the first electrode 108.

Herein, the color layer 114 may be disposed to expose an edge of the first layer 108a of the first electrode 108. In addition, the third layer 108c of the first electrode 108 may be formed or located, so as to surround the first layer 108a and the second layer 108b of the first electrode 108 and a side of the color layer 114. As a result, holes may be smoothly transferred from the first layer 108a to the third layer 108c of the first electrode 108.

Herein, the color layer 114 may be constituted by colors including red, green, blue, white, or a combination thereof. As a result, a luminance efficiency of the organic light emitting element 111 disposed in the white sub-pixel can be improved. Further, the height of the color layer 114 is smaller than heights of the red color filter 202a, the green color filter 202b, and the blue color filter 202c, and thus, a color of the color layer 114 may not be recognized in the white sub-pixel area.

In addition, the bank pattern 112 may be disposed to expose a part of the first electrode 108. Particularly, the bank pattern 112 may be disposed to expose a part of the third layer 108c of the first electrode 108.

The bank pattern 112 may define an emission area EA and a non-emission area NEA of the OLED display device. Particularly, the emission area EA of the OLED display device is defined as an area between the bank pattern 112 and another bank pattern 112 that is spaced apart from the bank pattern 112, and the remaining area excluding the emission area EA may be defined as the non-emission area NEA.

Further, an organic light emitting layer 109 may be disposed on the first substrate 100 including the bank pattern 112. The organic light emitting layer 109 is constituted by a single layer, but is not limited thereto, and may be constituted by multilayers of a hole injection layer, a hole transporting layer, a light emitting material layer, an electron transporting layer, and an electron injection layer.

The second electrode 110 of the organic light emitting element 111 is disposed on the organic light emitting layer 109. In this case, the second electrode 110 may be made of a material with a low work function. For example, the second electrode 110 may include any one selected from a group including Mg, Ca, Al, Al-alloy, Ag, Ag-alloy, Au, and Au-alloy, but is not limited thereto.

In the organic light emitting element 111, when a predetermined voltage is applied to the first electrode 108 and the second electrode 110 according to a selected color signal, the holes provided from the first electrode 108 and the electrons provided from the second electrode 110 are transported to the organic light emitting layer 111 to form excitons. When the excitons are transited from an excited state to a ground state, light is generated and emitted in a visible-light form.

Further, the second substrate 200 is disposed to face the first substrate 100. On one surface of the second substrate 200 facing the first substrate 100, a black matrix 201, a color filter layer 202, a non color filter area 500, and an overcoat layer 210 are disposed.

Particularly, on one surface of the second substrate 200, the black matrix 201 defining white, red, green, and blue sub-pixels is disposed. The black matrix 201 may be disposed to be spaced apart from another black matrix adjacent to the black matrix 201. As a result, an opening may be formed between the black matrix 201 and another black matrix adjacent to the black matrix 201.

The color filter layer 202 may be disposed on the opening. That is, the color filter layer 202 may be disposed in each sub-pixel area defined by the black matrix 201. Further, the color filter layer 202 is constituted by a plurality of color filters. Particularly, the color filter layer 202 may include a red color filter 202a, a green color filter 202b, and a blue color filter 202c. The red color filter 202a is disposed on the red sub-pixel, the green color filter 202b is disposed on the green sub-pixel, and the blue color filter 202c is disposed on the blue sub-pixel.

Herein, the second substrate 200 may include a non color filter area 500 in an area corresponding to the area with the color layer 114 of the first substrate 100. The non color filter area 500 may be disposed on the same layer as the red 202a, green 220b, and blue 220c color filters. That is, the non color filter area 500 may be the same area as the white sub-pixel area. Herein, the non color filter area refers to an area of the color filter layer 202 that does not have a color filter.

In order to increase the transmittance of the OLED display device, a stack structure without a circular polarizer is proposed. In order to reduce an amount of reflectance of the OLED display device, the color filter is disposed in the area corresponding to the white sub-pixel of the second substrate 200 of the OLED display device.

When an external light is incident onto the second substrate from the outside, the light may also be incident onto the first substrate through the second substrate. In this case, the incident light is reflected by the reflective layer disposed on the first substrate to be emitted in the second substrate direction, and the reflected light is absorbed by the color filter, thereby reducing an amount of reflectance of the external light. However, since the color filter is disposed in the area corresponding to the white sub-pixel, a luminance efficiency of the white sub-pixel area may be reduced and a power consumption of the OLED display device may increase.

In the OLED display device according to the first exemplary embodiment of the present invention, the non color filter area is provided in the area corresponding to the white sub-pixel of the second substrate 200, and the color layer 114 is disposed in the area corresponding to the white sub-pixel of the first substrate 100 disposed to face the second substrate 200, thereby reducing power consumption while lowering amount of reflectance of external light.

Particularly, light incident onto the white sub-pixel area from the outside is reflected by reaching the second layer 108b of the first electrode 108 of the organic light emitting element 111 disposed on the first substrate 100 through the second substrate 200, and the reflected light is absorbed by reaching the color layer 114, thereby lowering an amount of reflectance of the external light.

Further, some of the light generated from the organic light emitting layer 109 is emitted in the second substrate 200 direction. In addition, some of the remaining light generated from the organic light emitting layer 109 is emitted in a direction of a rear surface of the first substrate 100, and the emitted light is reflected on the second layer 108b of the first electrode 108 to change a path in the second substrate 200 direction. In this case, the light with the changed path is partially absorbed in the color layer 114 while passing through the color layer 114 to be emitted to the outside of the second substrate 200.

As a result, the light emitted to the second substrate 200 without passing through the color layer 114 may not pass through the color layer 114 and may not be absorbed by the color layer 114. That is, when the color filter is disposed in the second substrate area corresponding to the white sub-pixel, an entire light generated from the organic light emitting layer passes through the color filter, thereby deteriorating light efficiency. On the contrary, when the color layer 114 is disposed on the first substrate 100, some of the light generated from the organic light emitting layer 109 passes without passing through the color layer 114, and as a result, light efficiency can be increased and power consumption can also be reduced.

In the OLED display device according to the first exemplary embodiment of the present invention, the color layer 114 is disposed on the first substrate 100 corresponding to the white sub-pixel and the non color filter area 500 is included in the second substrate 200 corresponding to the white sub-pixel, thereby lowering an amount of reflectance of external light, increasing a luminance efficiency of the organic light emitting element 111, and reducing a power consumption of the OLED display device.

Figure 3:
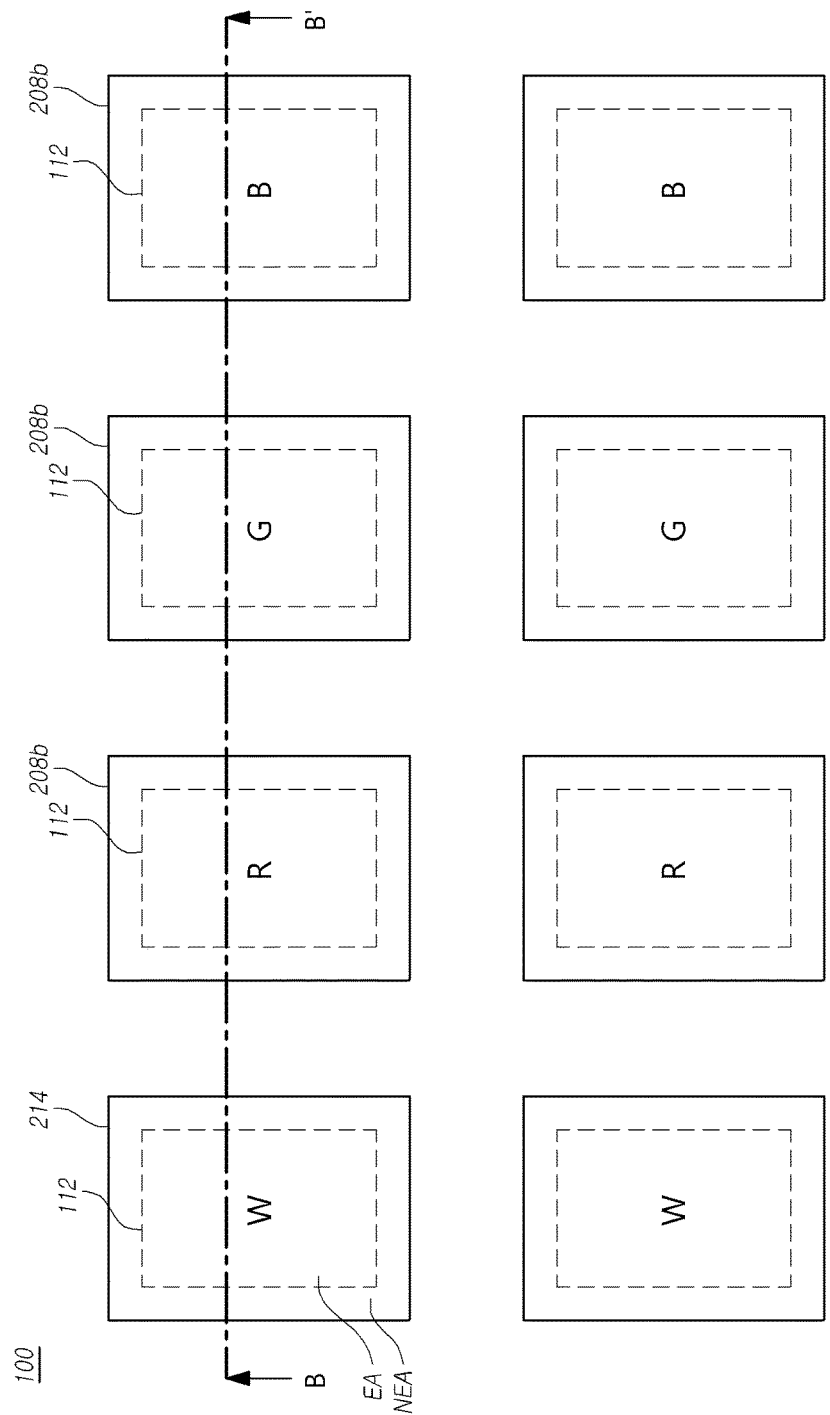
FIG. 3 is a plan view schematically illustrating an OLED display device according to a second exemplary embodiment of the present invention.
Figure 4:
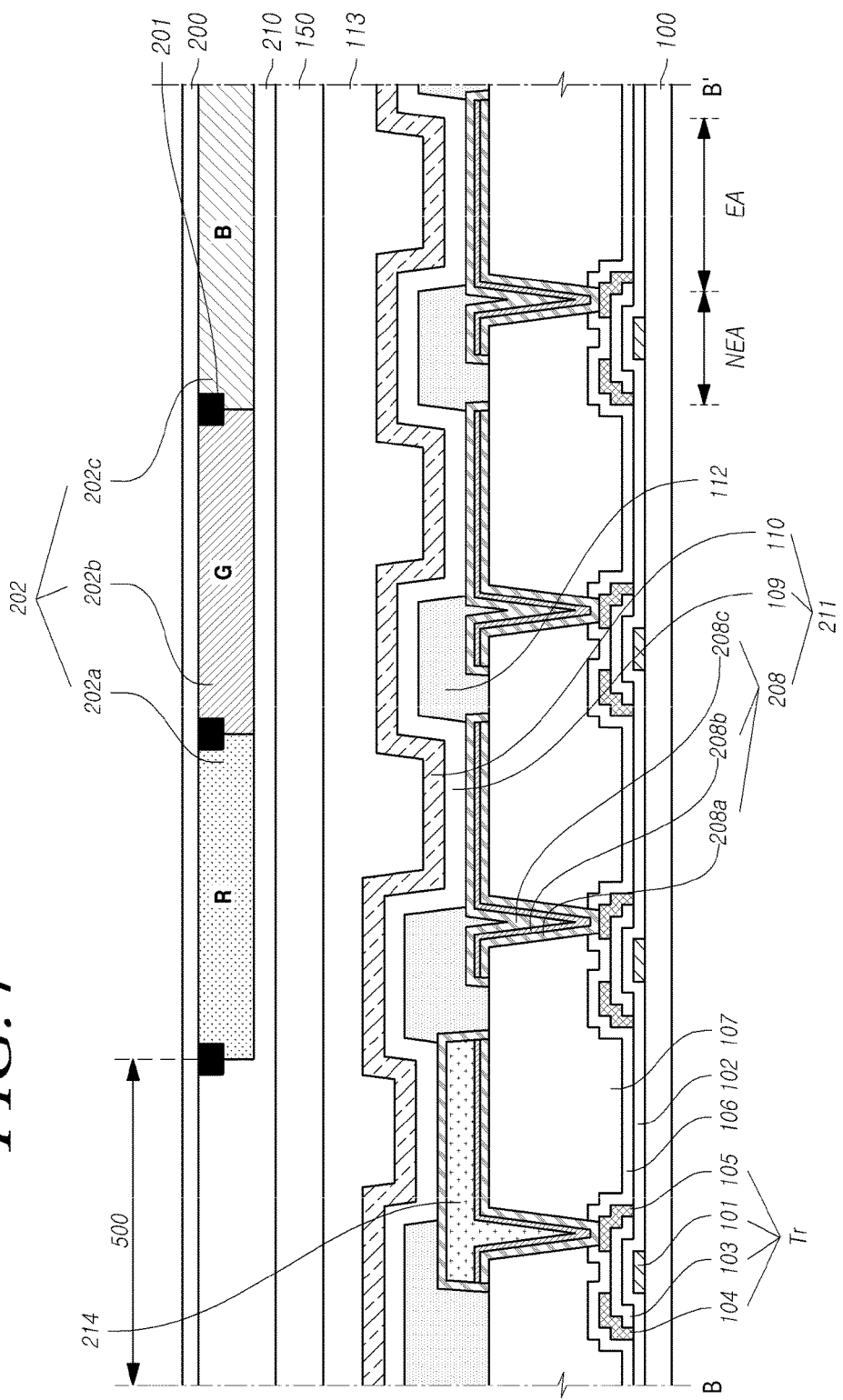
FIG. 4 is a cross-sectional view of the OLED display device taken along line B-B' according to the second exemplary embodiment of the present invention.

An OLED display device according to a second exemplary embodiment of the present invention will now be described with reference to FIGS. 3 and 4. FIG. 3 is a plan view schematically illustrating an OLED display device according to a second exemplary embodiment of the present invention. FIG. 4 is a cross-sectional view of the OLED display device taken along line B-B' according to the second exemplary embodiment of the present invention. The OLED display device according to the second exemplary embodiment of the present invention may include the same constituted elements as the first exemplary embodiment described above. Thus, duplicate description may be omitted for conciseness. Further, like constituted elements have like reference numerals.

Referring to FIGS. 3 and 4, an OLED display device according to a second exemplary embodiment of the present invention includes a plurality of sub-pixels disposed on a first substrate 100. Particularly, the OLED display device includes a plurality of white W sub-pixels, red R sub-pixels, green G sub-pixels, and blue B sub-pixels, which are disposed on the first substrate 100.

A bank pattern 112 defining an emission area EA and a non-emission area NEA is disposed in each sub-pixel area of the first substrate 100, and a first electrode 208 of the organic light emitting element is disposed below the bank pattern 112. Herein, the first electrode 208 may be constituted by multiple layers. Meanwhile, in the white W sub-pixel area, a color layer 214 overlapping with the bank pattern 112 may be further included.

Particularly, in the white W sub-pixel area, a second layer 208b is disposed on the first layer 208a of the first electrode 208, a color layer 214 is disposed on the second layer 208b, and a third layer 208c of the first electrode 208 is disposed on the color layer 214. Herein, an end of the color layer 214 may be disposed to overlap with ends of the first layer and the second layer 208b of the first electrode. Such a structure will be described below in detail with reference to FIG. 4.

The OLED display device according to the second exemplary embodiment of the present invention includes a thin film transistor Tr disposed in an area corresponding to each sub-pixel and an organic light emitting element 211 electrically connected with the thin film transistor.

The first electrode 208 of the organic light emitting element 211 is constituted by a first layer 208a, a second layer 208b overlapping with the first layer 208a, and a third layer 208c overlapping with the second layer 208b. The ends of the first layer 208a and the second layer 208b overlap with each other and the third layer 208c may be formed or located to surround sides of the first layer 208a and the second layer 208b.

Meanwhile, in the white sub-pixel, a color layer 214 disposed between the second layer 208b and the third layer 208c of the first electrode 208 is included. In this case, the end of the color layer 214 may be formed or located to overlap with the first layer 208a and the second layer 208b of the first electrode 208.

The end of the color layer 214 is formed or located to overlap with the first layer 208a and the second layer 208b of the first electrode 208, thereby simplifying the fabrication process. Particularly, a first layer 208a material of the first electrode 208 is formed or located on the first substrate 100, a second layer 208b material is formed or located on the first layer 208a material, the color layer 214 is formed or located by forming and etching a color layer 214 material on the second layer 208b material, and a third layer 208c material of the first electrode 208 is formed or located on the first substrate 100 and the color layer 214. Thereafter, the first electrode 208 and the color layer 214 may be formed or located by integrally etching the first layer 208a, second layer 208b, and third layer 208c materials of the first electrode 208.

In addition, an area of the second substrate 200 corresponding to the white sub-pixel of the first substrate 100 may be a non color filter area 500. That is, in the white sub-pixel area, when the color layer 214 is disposed on the first substrate 100, the color layer 214 may be constituted so that the color filter is not disposed on the second substrate 200.

In the OLED display device according to the second exemplary embodiment of the present invention, it is possible to lower an amount of reflectance of external light, increase a luminance efficiency of the organic light emitting element 211, reduce power consumption, and simplify the fabrication process.

Figure 5:
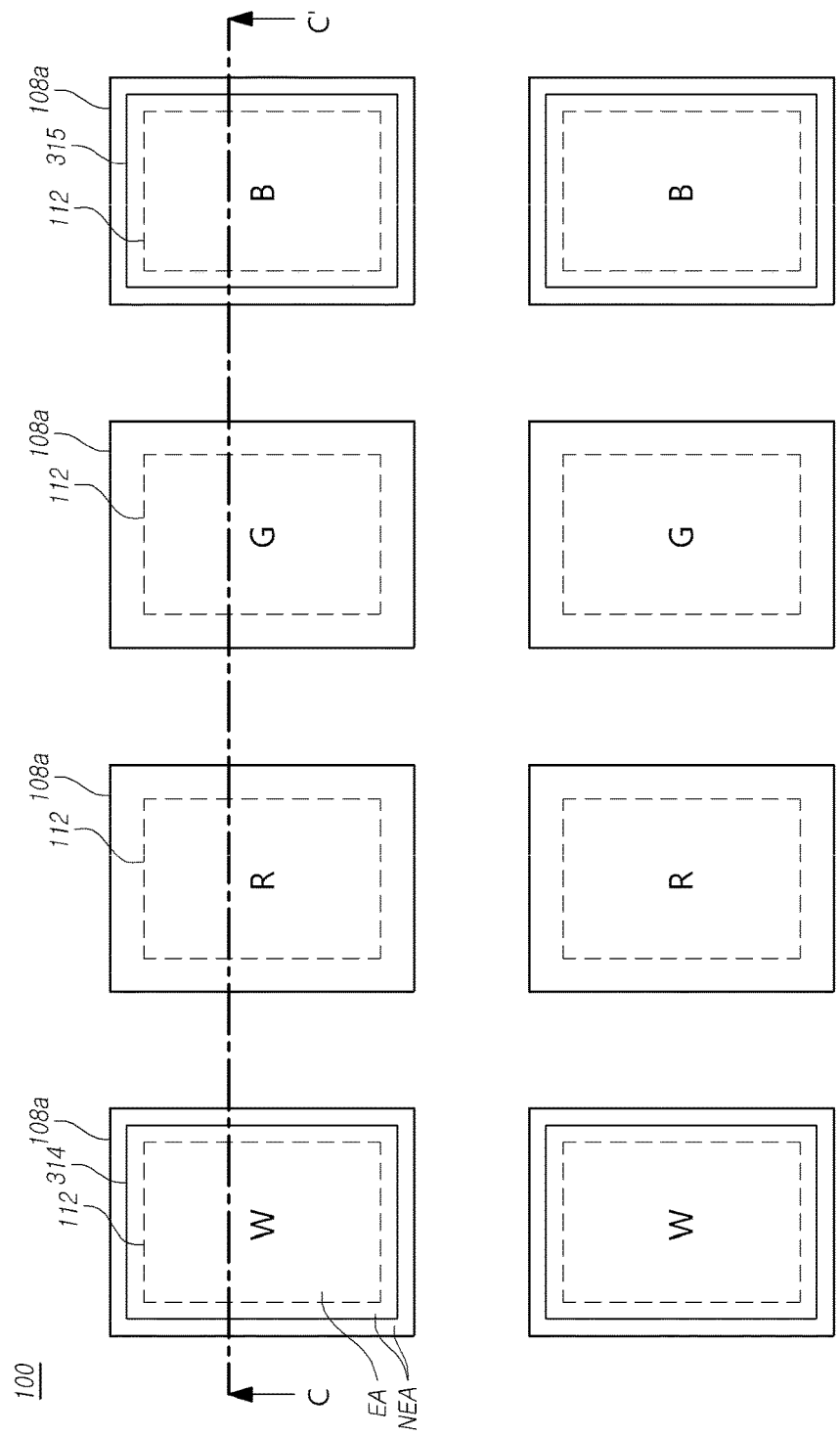
FIG. 5 is a plan view schematically illustrating an OLED display device according to a third exemplary embodiment of the present invention.
Figure 6:
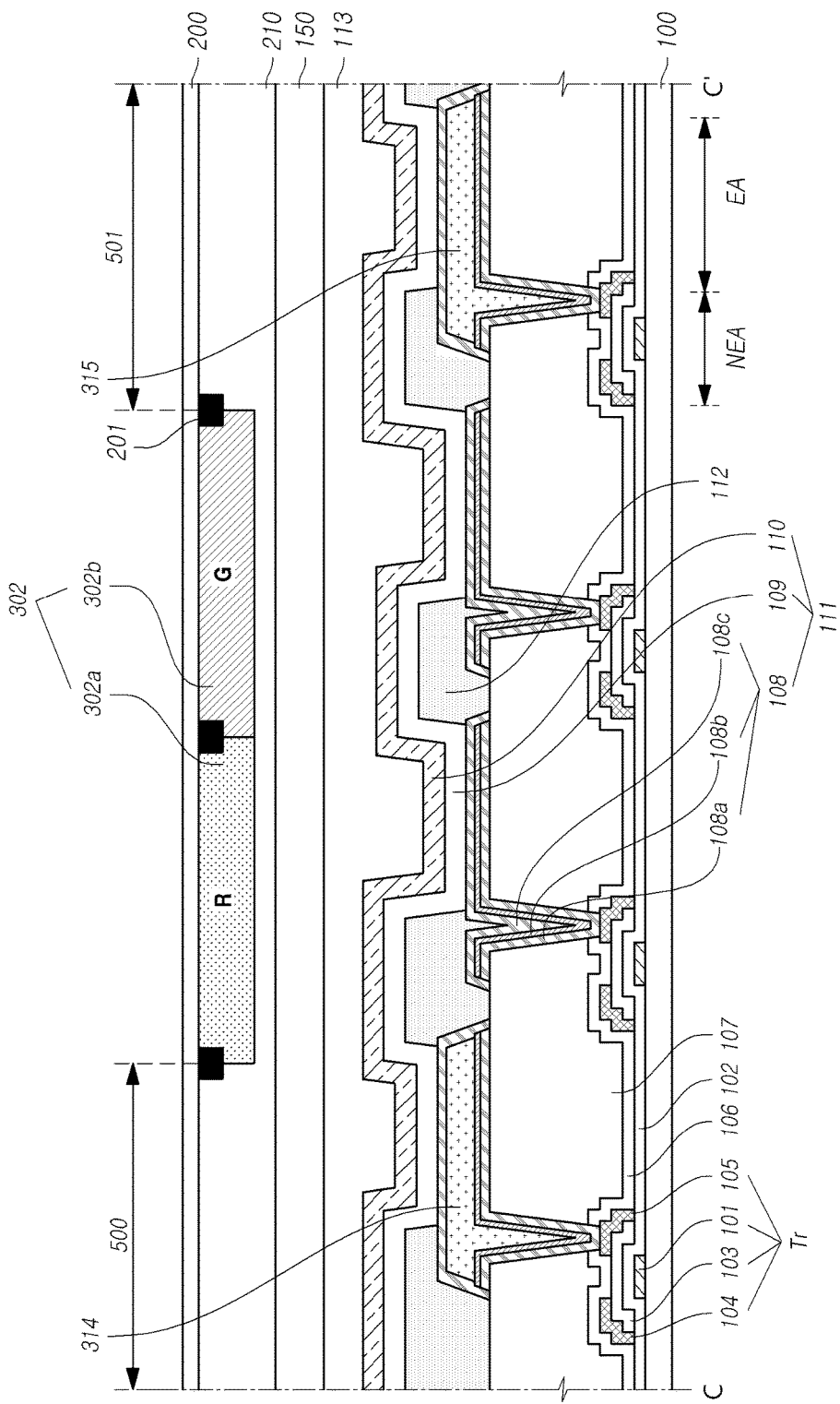
FIG. 6 is a cross-sectional view of the OLED display device taken along line C-C' according to the third exemplary embodiment of the present invention.

An OLED display device according to a third exemplary embodiment of the present invention will now be described below with reference to FIGS. 5 and 6. FIG. 5 is a plan view schematically illustrating an OLED display device according to a third exemplary embodiment of the present invention. FIG. 6 is a cross-sectional view of the OLED display device taken along line C-C' according to the third exemplary embodiment of the present invention. The OLED display device according to the third exemplary embodiment of the present invention may include the same constitute elements as the aforementioned exemplary embodiments. Thus, duplicative description may be omitted for conciseness. Further, like reference numerals refer to like elements.

Referring to FIGS. 5 and 6, the OLED display device according to the third exemplary embodiment of the present invention includes a first color layer disposed on a white W sub-pixel of the first substrate 100 and a second color layer 315 disposed on a blue B sub-pixel. Herein, the first color layer 314 and the second color layer 315 may be disposed on the same layer.

That is, in the white W and blue B sub-pixel areas, the second layer 108b may be disposed on the first layer 108a of the first electrode 108 of the organic light emitting element 111 and each of the first color layer 314 and the second color layer 315 may be disposed on the second layer 108b. Further, Herein, the bank pattern 112 may be disposed to overlap with parts of the first color layer 314 and the second color layer 315. In addition, the third layer 108c of the first electrode 108 may be disposed on the first color layer 314 and the second color layer 315. Such a structure will be reviewed below in detail with reference to FIG. 6.

In the OLED display device according to the third exemplary embodiment of the present invention, the first color layer 314 and the second color layer 315 are disposed in the areas corresponding to the white and blue sub-pixels, respectively. Herein, the first color layer 314 disposed in the area corresponding to the white sub-pixel may be configured to be red, green, blue, white, or a color formed in a combination thereof. Further, the second color layer 315 may be disposed in the area corresponding to the blue sub-pixel. As a result, the blue B sub-pixel area may emit a blue B.

Further, the white sub-pixel area of the second substrate 200 may be a first non color filter area 500. In addition, the blue sub-pixel area of the second substrate 200 may be a second non color filter area 501.

That is, in the white sub-pixel area, when the first color layer 314 is disposed on the first substrate 100, a color filter may be configured not to be disposed on the second substrate 200. Further, in the blue sub-pixel area, when the second color layer 315 is disposed on the first substrate 100, the color filter may be configured not to be disposed on the second substrate 200. In this case, a color filter layer 302 disposed on one surface of the second substrate 200 may be constituted only by a red color filter 302a and a green color filter 302b. As a result, light efficiency may increase even in the blue sub-pixel area in addition to the white sub-pixel area.

In this embodiment, the second color layer 315 is disposed in the blue sub-pixel area as illustrated in FIGS. 5 and 6, but the second color layer 315 is not limited thereto and may be, for example, disposed in the red sub-pixel area or the green sub-pixel area.

For example, the second color layer 315 may be disposed in the red sub-pixel area of the first substrate 100. In this case, the second color layer 315 may be configured to be red. Further, in the red sub-pixel area, the second non color filter area 501 may be disposed on one surface of the second substrate 200. Moreover, the second color layer 315 may be disposed in the green sub-pixel area of the first substrate 100. In this case, the second color layer 315 may be configured to be green. Further, in the green sub-pixel area, the second non color filter area 501 may be disposed on one surface of the second substrate 200.

The OLED display device according to the third exemplary embodiment of the present invention includes the first color layer 314 and the second color layer 315 to improve light efficiency even in the red, green, or blue sub-pixel in addition to the white sub-pixel.

Figure 7:
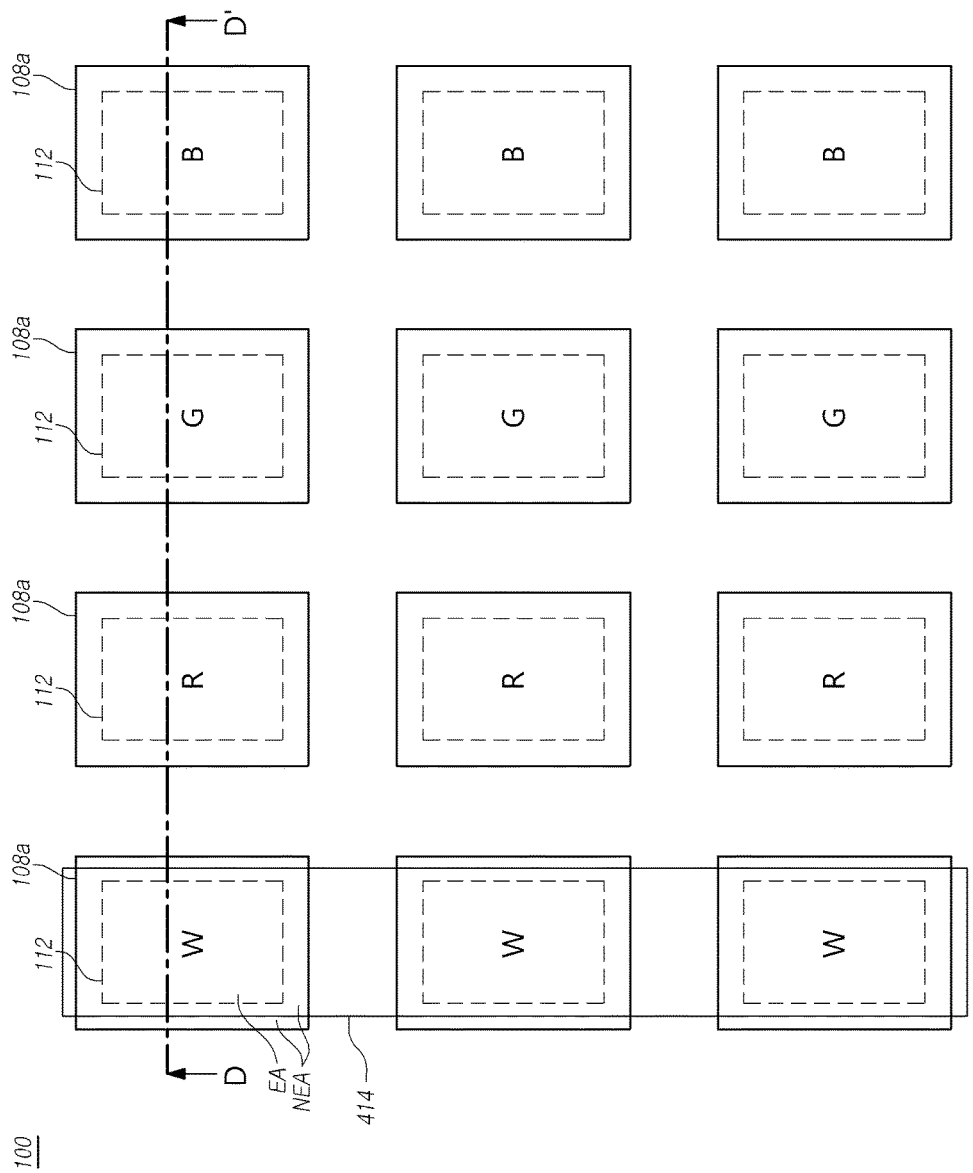
FIG. 7 is a plan view schematically illustrating an OLED display device according to a fourth exemplary embodiment of the present invention.
Figure 8:
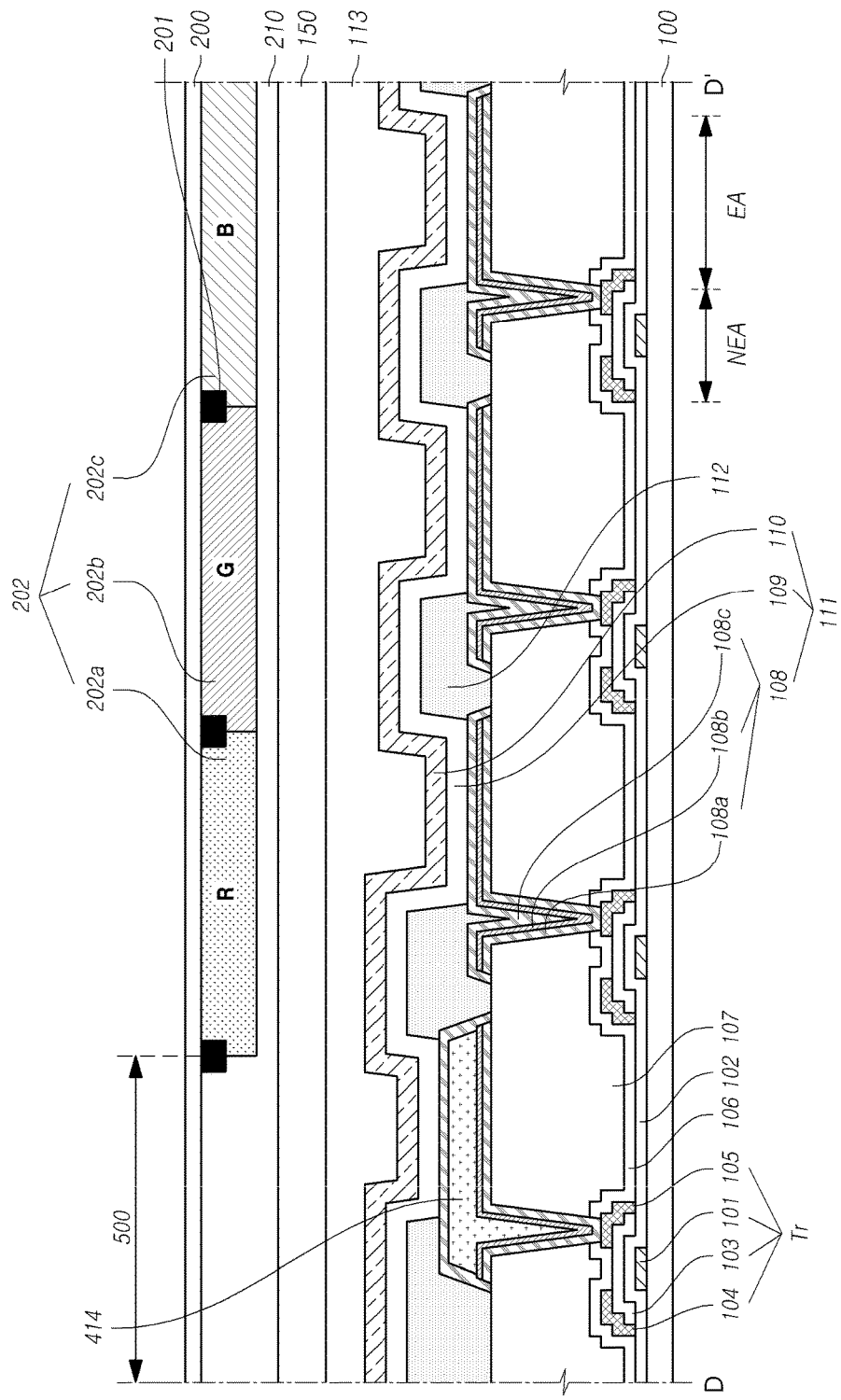
FIG. 8 is a cross-sectional view of the OLED display device taken along line D-D' according to the fourth exemplary embodiment of the present invention.

An OLED display device according to a fourth exemplary embodiment of the present invention will now be described with reference to FIGS. 7 and 8. FIG. 7 is a plan view schematically illustrating an OLED display device according to a fourth exemplary embodiment of the present invention. FIG. 8 is a cross-sectional view of the OLED display device taken along line D-D' according to the fourth exemplary embodiment of the present invention. The OLED display device according to the fourth exemplary embodiment of the present invention may include the same components as the aforementioned exemplary embodiments. Thus, duplicative description may be omitted for conciseness. Further, like reference numerals refer to like constitute elements.

Referring to FIGS. 7 and 8, in the OLED display device according to the fourth exemplary embodiment of the present invention, a plurality of white W sub-pixels may be disposed in line in a vertical direction which is a longitudinal direction and a plurality of red R sub-pixels, green G sub-pixels, and blue B sub-pixels may also be disposed in line in the vertical direction.

Herein, the bank pattern 112 may be disposed in the white W, red R, green G, and blue B sub-pixel areas and a color layer 414 may be disposed in the white W sub-pixel area in a stripe pattern. In detail, the color layer 414 may be integrally formed or located on the white W sub-pixel disposed in line in a vertical direction. In this case, the color layer 414 may be interposed between the second layer 108b and the third layer 108c of the first electrode 108 of the organic light emitting element 111 in the white W sub-pixel.

In this embodiment, the color layer 414 is integrally formed or located on the white W sub-pixel as illustrated in FIGS. 7 and 8, but the embodiment of the present invention is not limited thereto and the color layer 414 may be, for example, further integrally formed or located on at least one sub-pixel among red R, green G, and blue B sub-pixels. Herein, when the color layer 414 is further disposed in the blue B sub-pixel area, the blue color filter 202c may not be disposed on one surface of the second substrate 200 of the OLED display device.

In the OLED display device according to the fourth exemplary embodiment of the present invention, the color layer 414 is integrally formed or located in the plurality of white W sub-pixel areas disposed in a vertical direction and the color layer 414 may be thus formed or located in the plurality of white W sub-pixels at once, and as a result, a process of forming the color layer 414 may be simplified.

Figure 9:
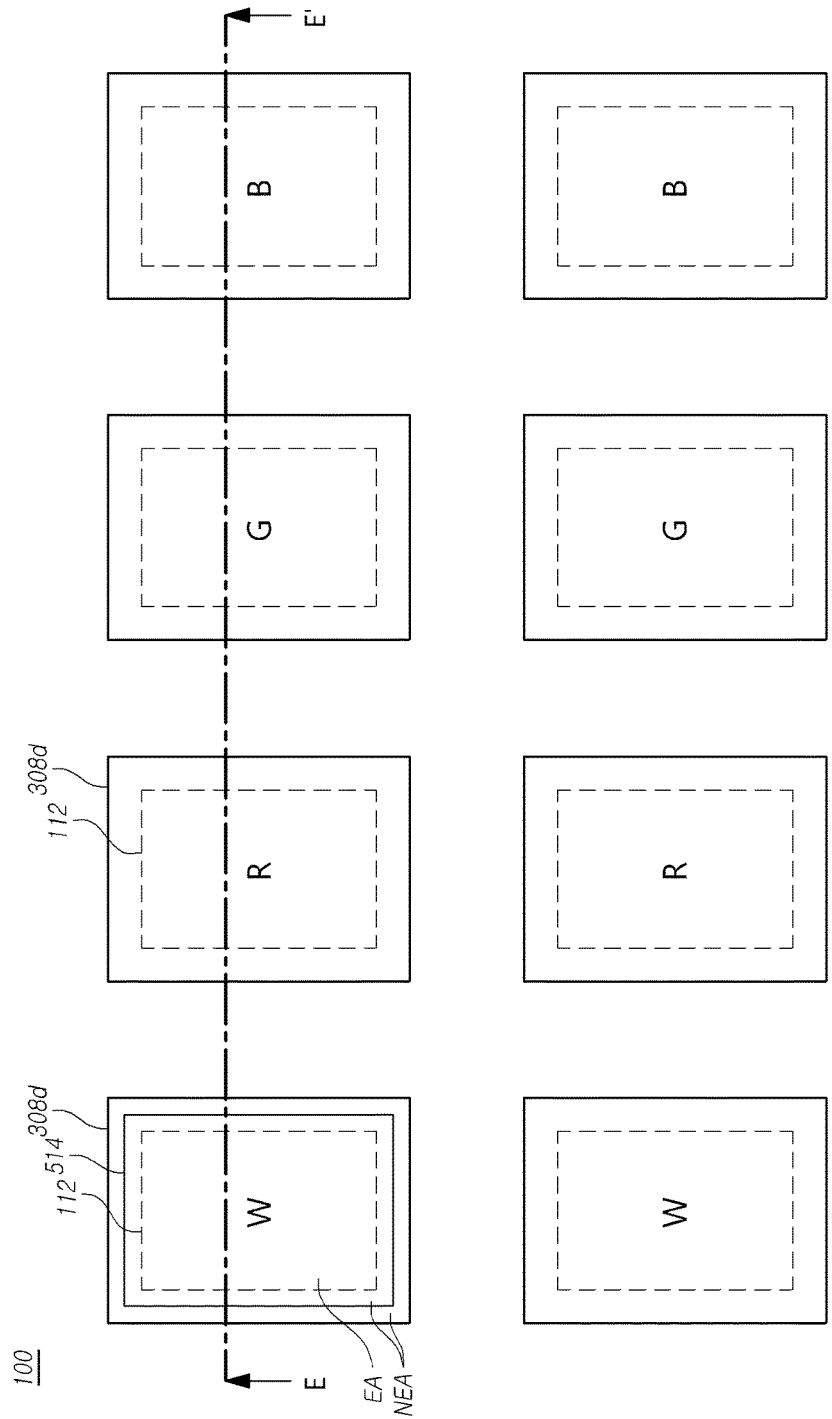
FIG. 9 is a plan view schematically illustrating an OLED display device according to a fifth exemplary embodiment of the present invention.
Figure 10:
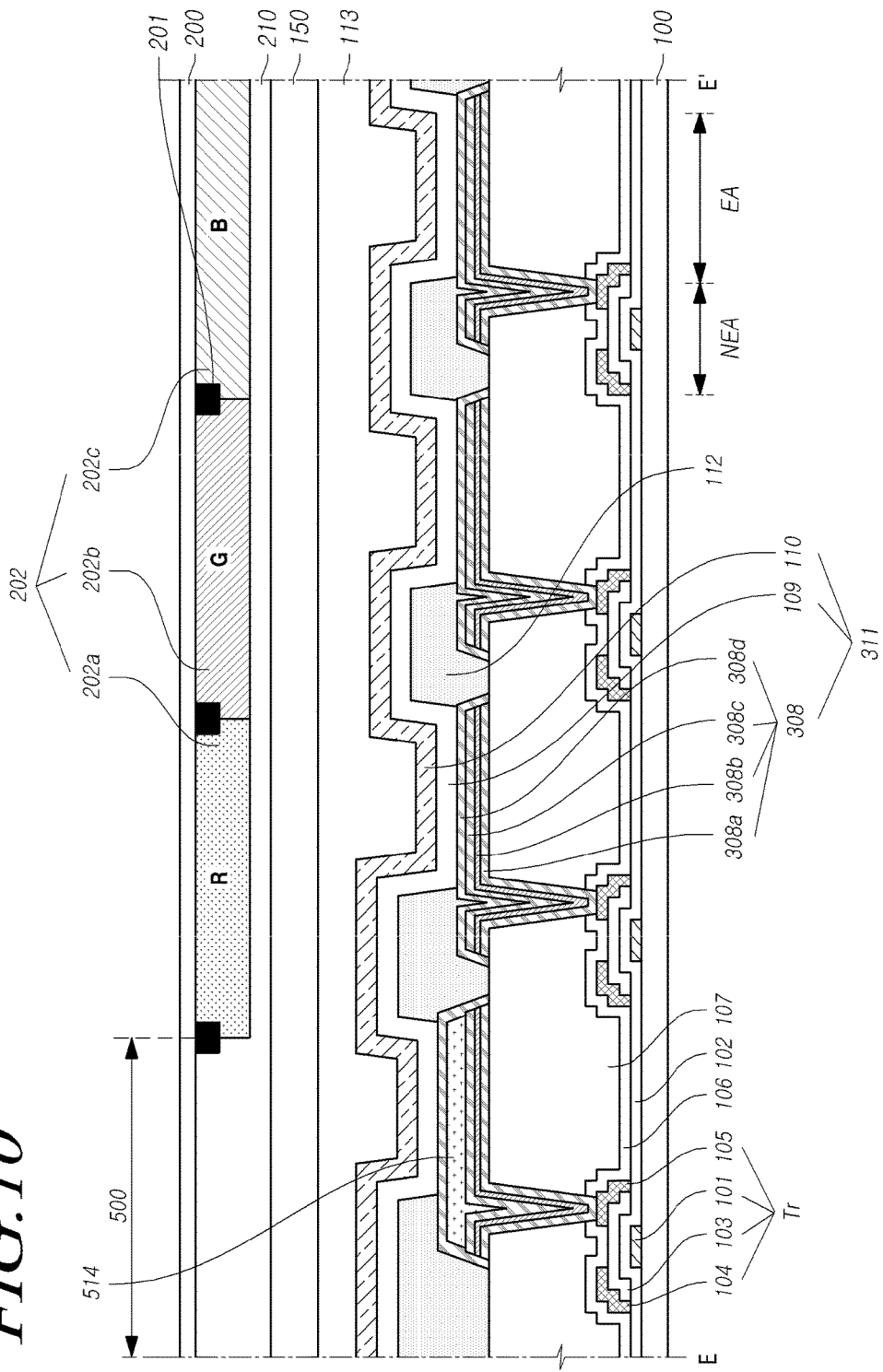
FIG. 10 is a cross-sectional view of the OLED display device taken along line E-E' according to the fifth exemplary embodiment of the present invention.

An OLED display device according to a fifth exemplary embodiment of the present invention will now be described with reference to FIGS. 9 and 10. FIG. 9 is a plan view schematically illustrating an OLED display device according to a fifth exemplary embodiment of the present invention. FIG. 10 is a cross-sectional view of the OLED display device taken along line E-E' according to the fifth exemplary embodiment of the present invention. The OLED display device according to the fifth exemplary embodiment of the present invention may include the same components as the aforementioned exemplary embodiments. Thus, duplicative description may be omitted for conciseness. Further, like reference numerals refer to like elements.

Referring to FIGS. 9 and 10, the OLED display device according to the fifth exemplary embodiment of the present invention includes the plurality of white W sub-pixels, red R sub-pixels, green G, and blue B sub-pixels disposed on the first substrate 100. The bank pattern 112 is disposed in each sub-pixel area of the first substrate 100 and the first electrode 308 of the organic light emitting element 311 is disposed below the bank pattern 112. Herein, the first electrode 308 may be constituted by multiple layers. In detail, the first electrode 308 may be constituted by quadruple layers.

In this case, in the respective sub-pixel areas, the bank pattern 112 is disposed to overlap with parts of a first layer 308a of the first electrode 308, a second layer 308b disposed on the first layer 308a, a fourth layer 308c disposed on the second layer 308b, and a third layer 308d disposed on the fourth layer 308c. Meanwhile, the white W sub-pixel area may further include a color layer 514 which overlaps with the bank pattern 112.

In detail, in the white W sub-pixel area, the second layer 308b may be disposed on the first layer 308c of the first electrode 308, the fourth layer 308c may be disposed on the second layer 308b, the color layer 514 may be disposed on the fourth layer 308c, and the third layer 308d of the first electrode 308 may be disposed on the color layer 214.

Herein, the first layer 308a, the third layer 308d, and the fourth layer 308c of the organic light emitting element 311 may be made of a transparent conductive material and the second layer 308b may be made of a reflective material. In this case, the fourth layer 308c of the first electrode 308 made of the transparent conductive material is further disposed between the second layer 308b made of the reflective material and the color layer 514 to reduce or prevent the second layer 308b from being oxidized during a process of forming the color layer 514.

In this embodiment, the color layer 514 is disposed in the white W sub-pixel area in FIGS. 9 and 10, but the embodiment of the present invention is not limited thereto, and the color layer 514 may be, for example, further disposed on at least one sub-pixel area among the red R, green G, and blue B sub-pixels.

The features, structures, effects, and the like described in the above exemplary embodiments are included in at least one exemplary embodiment and but are not limited to any one exemplary embodiment. In addition, the features, structures, effects, and the like described in the respective exemplary embodiments may be executed by those skilled in the art while being combined or modified with respect to other embodiments. Accordingly, it will be understood that contents related the combination and modification will be included in the scope of the present disclosure.

Further, it should be understood that the exemplary embodiments described above should be considered in a descriptive sense only and not for purposes of limitation. It will be understood by those skilled in the art that various other modifications and applications may be made therein without departing from the scope of the present invention, which is defined by the appended claims. For example, respective components exhibited in detail in the exemplary embodiments may be executed while being modified.

What is claimed is:

1. A thin film transistor array substrate comprising:
   a substrate divided into red, green, blue, and white sub-pixel areas;
   a thin film transistor and a light emitting layer in each sub-pixel area;
   a first electrode electrically connected with the thin film transistor and comprising a first layer and a third layer disposed to overlap with the first layer;
   a second layer being reflective and overlapping the first and third layers of the first electrode; and
   a first color layer between the first layer and the third layer of the first electrode in each white sub-pixel area,
   wherein the first layer of the first electrode is in contact with a drain electrode of the thin film transistor through a contact hole in which at least the first color layer and the first and second layers of the first electrode are disposed, and
   wherein the third layer of the first electrode is located, so as to surround the first layer of the first electrode and a side of the first color layer.

2. The thin film transistor array substrate of claim 1, wherein the first color layer is provided between the second layer and the third layer of the first electrode.

3. The thin film transistor array substrate of clam 1, further comprising:
   a bank pattern overlapping a part of an upper surface of the first electrode and defining an emission area and a non-emission area; and
   a second electrode on the light emitting layer and the bank pattern.

4. The thin film transistor array substrate of claim 1, wherein the light emitting layer is an organic light emitting layer.

5. The thin film transistor array substrate of claim 1, wherein the first color layer has a red color, a green color, a blue color, a white color, or a combination thereof.

6. The thin film transistor array substrate of claim 1, wherein the first color layer exposes an edge of the first layer of the first electrode.

7. The thin film transistor array substrate of claim 1, wherein an end of the first color layer overlaps an end of the first layer of the first electrode.

8. The thin film transistor array substrate of claim 2, further comprising:
   a fourth layer on the second layer of the first electrode in the white, red, green, and blue sub-pixel areas.

9. The thin film transistor array substrate of claim 8, wherein the first layer, the third layer, and the fourth layer of the first electrode are made of transparent conductive materials.

10. The thin film transistor array substrate of claim 1, wherein the first color layer is integrally constituted in a plurality of white sub-pixel areas in a direction parallel with one of axes defining a display area of the thin film transistor array substrate.

11. The thin film transistor array substrate of claim 1, further comprising a second color layer on a same layer as the first color layer in at least one area of the red, green, and blue sub-pixel areas.

12. The thin film transistor array substrate of claim 11, wherein the second color layer is a red color in the red sub-pixel area, a green color in the green sub-pixel area, and a blue color in the blue sub-pixel area.

13. An organic light emitting diode (OLED) display device having a thin film transistor array substrate comprising:
   a plurality of pixels on a substrate, each pixel including red, green, blue, and white sub-pixel areas;
   a thin film transistor and an organic light emitting layer in each sub-pixel area; and
   a first electrode in each sub-pixel area, the first electrode electrically connected with the thin film transistor and including a first color layer in the white sub-pixel area,
   wherein the first electrode further includes a first layer and a third layer on the first layer, and wherein the first color layer is between the first layer and the third layer of the first electrode in the white sub-pixel area,
   wherein the first layer of the first electrode is in contact with a drain electrode of the thin film transistor through a contact hole in which at least the first color layer and the first layer of the first electrode are disposed, and
   wherein the third layer of the first electrode is located, so as to surround the first layer of the first electrode and a side of the first color layer.

14. The OLED display device of claim 13, wherein the first electrode further comprises a second layer overlapping the first layer, wherein the third layer overlaps the second layer, and wherein the first color layer is provided between the second layer and the third layer of the first electrode.

15. The OLED display device of claim 14, further comprising a fourth layer on the second layer of the first electrode in the white, red, green, and blue sub-pixel areas.

16. The OLED display device of claim 15, wherein the first layer, the third layer, and the fourth layer of the first electrode are made of transparent conductive materials and the second layer thereof is made of a reflective material.

17. The OLED display device of claim 13, further comprising:
   a bank pattern overlapping a part of an upper surface of the first electrode and defining an emission area and a non-emission area; and
   a second electrode on the organic light emitting layer and the bank pattern.

18. The OLED display device of claim 13, wherein the first color layer exposes an edge of the first layer of the first electrode.

19. The OLED display device of claim 13, wherein an end of the first color layer overlaps an end of the first layer of the first electrode.

* * * * *